United States Patent [19]
Duff

[11] Patent Number: 5,030,906
[45] Date of Patent: Jul. 9, 1991

[54] ELECTRICAL CONNECTING APPARATUS
[75] Inventor: James A. Duff, Omaha, Nebr.
[73] Assignee: Seagate Technology, Inc., Scotts Valley, Calif.
[21] Appl. No.: 468,472
[22] Filed: Jan. 18, 1990
[51] Int. Cl.[5] .......................... G01R 1/06; G01R 31/02
[52] U.S. Cl. .............................. 324/158 P; 324/158 F
[58] Field of Search ............... 324/158 F, 158 P, 72.5, 324/73.1; 439/152, 159, 160

[56] References Cited

U.S. PATENT DOCUMENTS

| | | | |
|---|---|---|---|
| 2,158,630 | 5/1939 | Lloyd | 173/324 |
| 2,343,552 | 3/1944 | Hollister et al. | 439/159 |
| 3,050,680 | 8/1962 | Fox | 324/51 |
| 3,414,814 | 12/1968 | Gilbertson et al. | 324/73 |
| 3,803,483 | 4/1974 | McMahon, Jr. | 324/51 |
| 4,225,819 | 9/1980 | Grau et al. | 324/415 |
| 4,229,691 | 10/1980 | Loesch | 324/51 |
| 4,232,262 | 11/1980 | Emo et al. | 324/65 |
| 4,498,047 | 2/1985 | Hexamer et al. | 439/152 |
| 4,658,212 | 4/1987 | Ozawa et al. | 324/158 |
| 4,734,651 | 3/1988 | Keller et al. | 324/538 |
| 4,757,254 | 7/1988 | Staples | 324/158 |

FOREIGN PATENT DOCUMENTS 0111762 7/1983 Japan ................................. 439/160

Primary Examiner—Ernest F. Karlsen
Attorney, Agent, or Firm—Edward P. Heller, III; Bill D. McCarthy

[57] ABSTRACT

An electrical connecting apparatus supporting a multiple pin connector under test so that the connector pins of the connector can be electrically engaged without touching the functional connecting surface of the connector pins, the apparatus comprising a housing member with a connector nesting cavity and a cantilever clamp for retaining the connector under test in the nesting cavity. A contact assembly causes plural spring biased pin contactors to contact the connector in a connected mode so as to make electrical contact while maintaining the pristine surface condition of the functional ends of the connector pins, and an ejector pin is provided to eject the connector from the nesting cavity in following testing thereof.

7 Claims, 2 Drawing Sheets

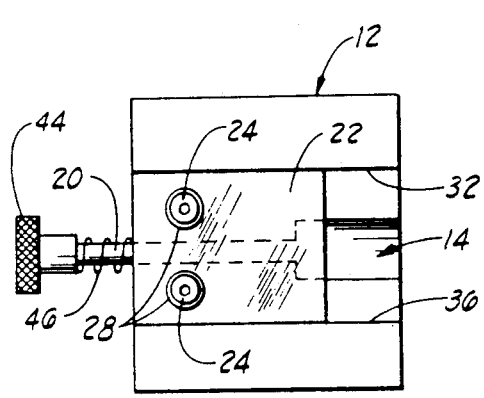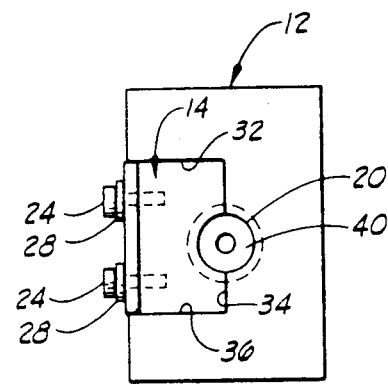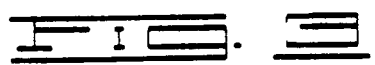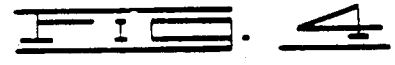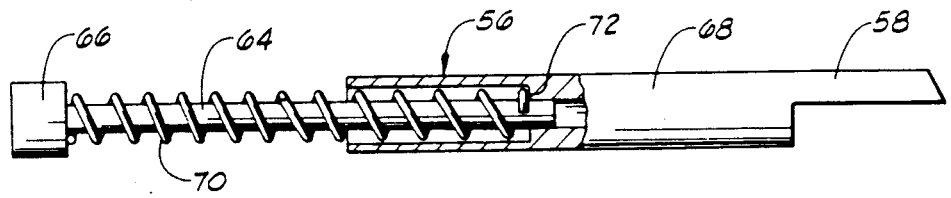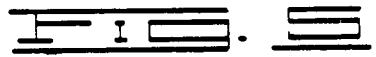

ELECTRICAL CONNECTING APPARATUS

BACKGROUND OF THE INVENTION

1. Field of the Invention

This invention relates to an apparatus for testing electrical equipment provided with multi-contact connectors, and more particularly, for an electrical connecting apparatus capable of testing without marring the conducting surface of the terminals on multi-contact connectors.

2. Discussion

Many kinds of electronic apparatus are designed, manufactured, and sold to be used in conjunction with other complex electronic equipment. Frequently much of that equipment has been made in a different location by a completely different manufacturer. Interconnection technology which has been developed over the years has produced a series of standard multi-pin connectors which are common throughout the industry. Thus, the purchaser knows that the connector on a computer printer, for example, from one source will match a receptacle on a computer from another source. An analogy can be made to the two-pronged plug on a common household electric lamp, which will match virtually any electrical receptacle in the country.

However, the voltages encountered in most electronic circuits are usually several orders of magnitude less than the 110 volts standard domestic electric service. These small voltages demand superb electric contact from one circuit to another; any contamination, corrosion, or misalignment of a single contact can result in failure of the involved circuitry.

The individual contacts on these standardized connectors are usually cylindrical, gold plated brass or other electrically conductive metal pins assembled in a regularly spaced array which fit with sliding engagement into mating receptacles of gold plated metallic tubes. Gold is usually the material of choice for all exposed surfaces of these connectors because of its superb electrical conductivity and excellent resistance to corrosion. However, gold is a relatively soft metal, and every insertion of a male connector pin into a female receptacle erodes the thin gold plate, so that after just a few cycles the underlying base metal can be exposed to atmospheric corrosion and potential subsequent circuit failure.

Thus, it is highly desirable for a manufacturer to ship to its customers connector apparatuses in an original, pristine condition, unmarred by any premature insertion into a mating receptacle. Offsetting this need is the necessity to thoroughly test the electrical circuitry of the manufactured article prior to shipment.

U.S. Pat. Nos. 2,158,630 and 3,414,814 teach spring-loaded contactors that just touch the surface of the end points of all circuit paths. U.S. Pat. No. 3,803,483 discloses a semiconductor structure for testing the inner connector networks on insulative surfaces which are to support integrated circuit chips in integrated circuit modules; and U.S. Pat. Nos. 4,225,819 and 4,232,262 disclose apparatuses for testing connectors to detect the presence of contaminating films and foreign materials on the contact terminals of a connector or the conducting fingers of a printed circuit board.

U.S. Pat. No. 4,229,691 discloses a method and apparatus for testing telephone cords which are terminated with modular plugs utilizing test probes brought into engagement with terminal blades on the plugs. U.S. Pat. No. 4,658,212 discloses an apparatus for examining the status of individual terminal pins in a connector by engaging the point of the pin with a spring driven test probe.

U.S. Pat. No. 4,734,651 discloses an apparatus for testing electrical continuity of electrical terminals of a multi-contact electrical connector by engaging a respective electrical test probe with each of the terminals and using a multiplexer to connect each test probe in turn to a continuity testing circuit under the control of a computer.

U.S. Pat. No. 4,757,254 discloses a high-speed, side access edge connector testing assembly wherein plural probe contacts are mounted to a movable, linear carriage so that the probe connectors can be moved into and out of contact with the edge connector of a unit under test.

SUMMARY OF THE INVENTION

The present invention provides an electrical connecting apparatus which supports a multiple pin connector under test so that the terminal pins of the connector can be electrically engaged without marring the connecting surface of said pins. The apparatus comprises a housing member which has a connector nesting cavity, and a cantilever clamp is supported by the housing member for retaining the connector under test in the nesting cavity. A contact assembly is provided for electrically contacting the pins of the connector, the contact assembly characterized as having a plurality of biased pin contactors disposed to touch the nonfunctional ends of the connector in a connected mode so as to make electrical contact while maintaining the pristine surface condition of the functional ends of the connector pins. An ejector device is disposed to eject the electrical connector from the connector nesting cavity in an unconnected mode.

An object of the present invention is to provide an apparatus for supporting a multiple pin connector under test so that electrical contact is made without physical defacement of the surface of the contact surfaces functional in the final application of the connector.

As will be shown hereinafter, it is Applicant's belief that Ozawa et al. and Hollister et al. (either singularly or in combination) do not disclose, teach or even suggest the electrical connecting apparatus as recited in each of Applicant's claims.

BRIEF DESCRIPTION OF THE DRAWINGS

FIG. 3 is a front elevational view of the connector nest assembly.

FIG. 4 is a side elevational view of the connector nest assembly.

FIG. 5 is a schematical representation of a typical biased pin connector.

DESCRIPTION

Figure 1:
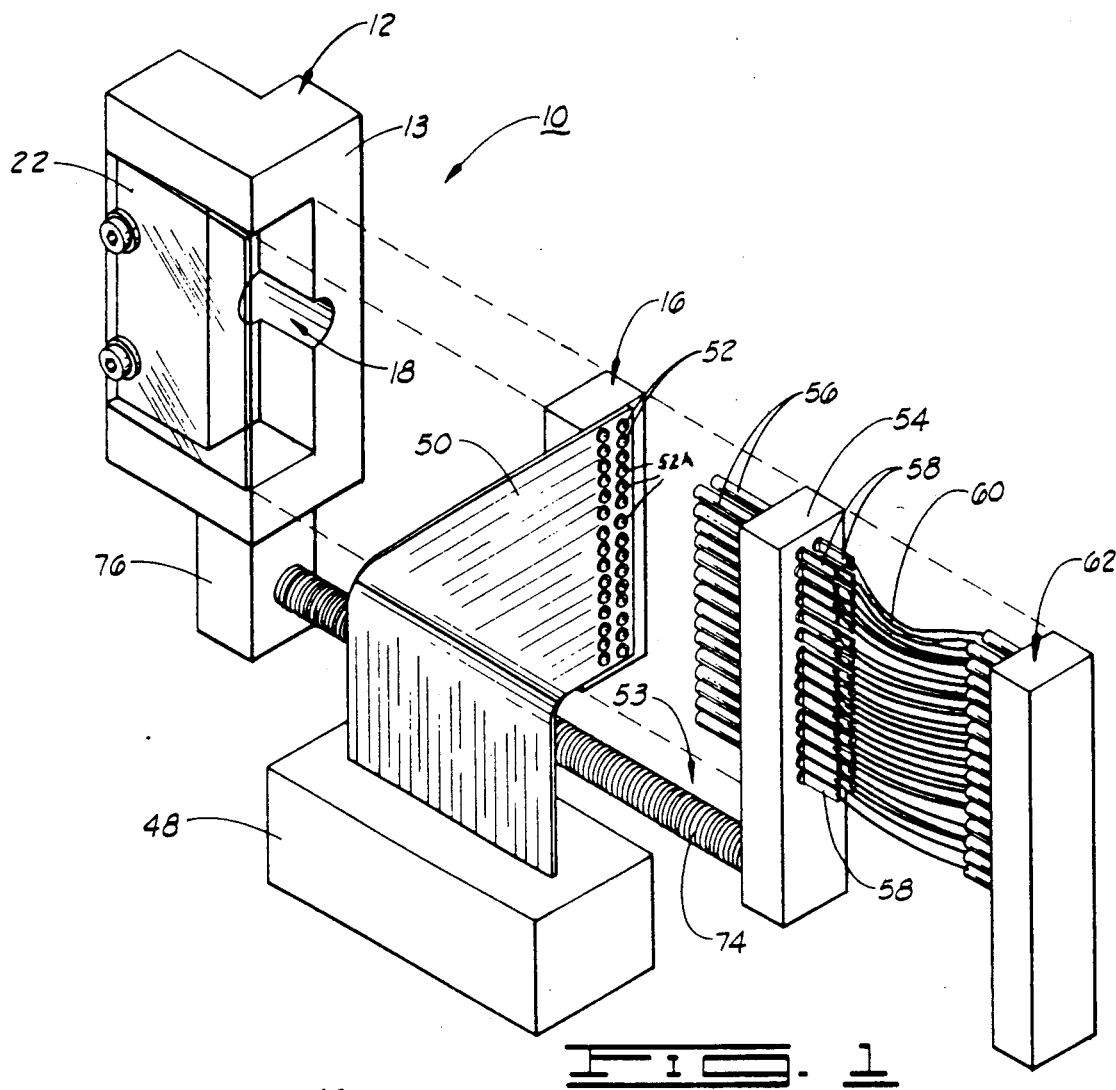
FIG. 1 is an isometric, semi-detailed view of an electrical connecting apparatus constructed in accordance with the present invention and showing the placement of a connector under test.
Figure 2:
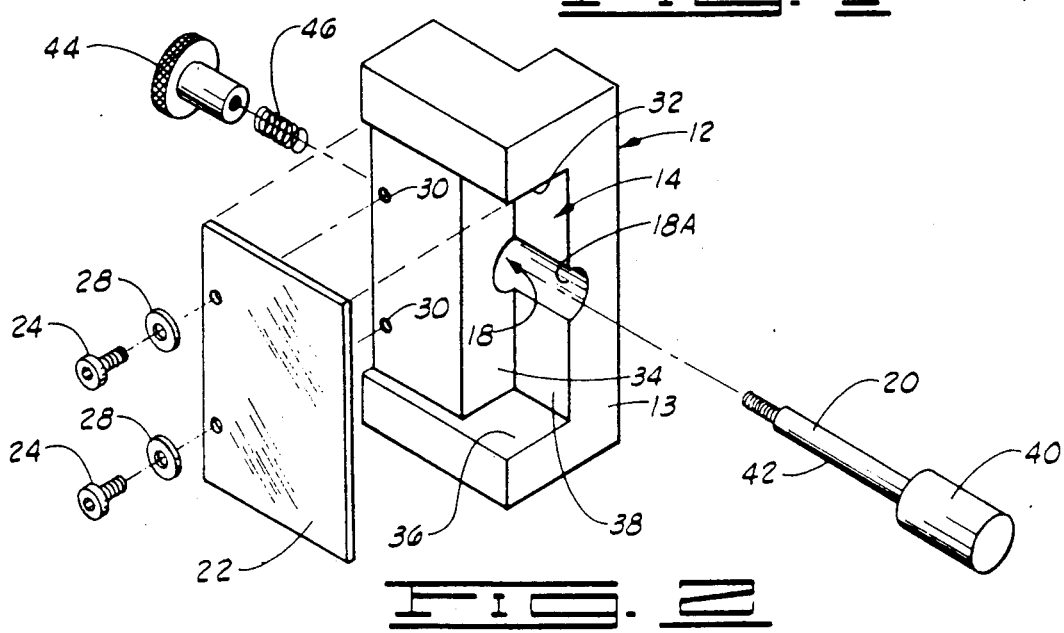
FIG. 2 is an exploded isometric view of the connector nest assembly of the electrical connecting apparatus of FIG. 1.

Referring to FIG. 1, shown therein is an electrical connecting apparatus 10 constructed in accordance with the present invention and comprising a connector nest assembly 12 preferably made of a plastic or other non-conducting material. As shown in FIGS. 2 through 4, the connector nest assembly 12 comprises a housing member 13 which is supported by a frame or the like (not shown) and which has a nesting cavity 14 suitably dimensioned to receive an electrical connector 16 under test. An ejector pin bore 18 extends through the housing member 13 and is appropriately sized to accommodate an ejector pin 20. A cantilever clamp 22 is fastened at one end thereof to the housing member 13 by pairs of attachment bolts 24, and washers 28 so that the outboard end of the clamp 22 is raised, or flexed, sufficiently by the connector 16 as the connector 16 is inserted into the nesting cavity 14.

The bolts 24 extend through holes in the cantilever clamp 22 and engage threaded holes 30 in the housing member 13 in sufficient depth to permit limited movement or flexing of the clamp 22. The clamp 22 is preferably made of a material which permits it to be subjected to repeated elastic bending. However, if desired, compression springs can be added under the bolts 24 to urge the clamp 22 toward the housing member 13 and to retain the connector 16 within the confines of the nesting cavity 14 in the connector nest assembly 12. The limits of the nesting cavity 14 are defined by an upper cavity side 32, an end cavity side 34, a lower cavity side 36 and a back cavity side 38.

The cantilever clamp 22 is preferably constructed of a transparent plastic, such as a polycarbonate, or other semi-rigid material which permits viewing the connector 16 under test to assure that it is properly seated in the nesting cavity 14. When so constructed, the clamp 22 is a semi-rigid or somewhat flexible member that is flexed sufficiently by action of the connector 16 as it is pushed into the nesting cavity 14 to permit passage thereof and to retain the connector 16 securely in the nesting cavity 14 until the connector 16 is ejected therefrom.

The ejector pin 20 is a rod member with a head portion 40 having a major diameter and a handle portion 42 having a minor diameter dimensioned to be slidingly received in the ejector pin bore 18 in the housing member 13. The distal end of the handle portion 42 is threaded to receive a thumb nut 44. A retraction spring 46 is disposed under the thumb nut 44. In its normal or rest position, the retraction spring 46 causes the ejector pin 20 to be withdrawn into the ejector pin bore 18 completely clear of the nesting cavity 14. Simple hand pressure against the thumb nut 44 will push the ejector pin 20 to assume its ejection position in which the ejector pin 20 extends into the nesting cavity 14 to eject the connector 16 from the nesting cavity 14 after completing the required tests. As shown, an ejector pin clearance path 18A is provided in the back cavity side 38 within the nesting cavity 14 for travel of the ejector pin 20.

As depicted in FIG. 1, a device 48 is under test. The device 48 has a cable 50 with the connector 16 secured to the distal end thereof. The connector 16 has a plurality of connector pins 52 which serve to provide electrical communication to the device 48 through the cable 50. The connector pins 52 have a front functional (connecting) end (not shown) and a back nonfunctional end 52. The back end is utilized to attach the individual connector pins 52 to individual conductors in the cable 50. It is to be understood that the depiction of the connector 16 and the connector nest assembly 12 is representative, and that a wide variety of sizes and shapes of connectors can be accommodated by the present invention.

A contact assembly 53 is provided for contacting a back, nonfunctional end 52A of the connector pins 52 and comprises a test contact holder 54 which is aligned with the connector 16 seated in the nesting cavity 14. The test contact holder 54 supports a plurality of biased pin contactors 56 (FIG. 5) positioned so that the nonfunctional end 52A of each of the connector pins 52 on the connector 16 is contacted by one of the biased pin contactors 56. Each biased pin contactor 56 has a terminal end 58, to which is attached a separate electrical conductor of a test cable 60, which in turn is attached to selected test equipment 62. Although not shown, the test cable 60 will normally be provided a slack loop or the like to accommodate travel of the contact assembly 53.

The biased pin contactor 56 utilized in the present invention is a typical contactor well known in the electronics industry, and is represented by the view in FIG. 5. All parts of the biased pin contactor 56 are usually constructed of electrically conductive metal which has been gold plated to enhance conductivity and to increase corrosion resistance. Such biased pin contactors 56 usually comprise a contact plunger 64 with a contact head 66 at its external end. The contact plunger 64 is slidingly engaged within a receiving tube 68, and a biasing spring 70 is disposed against an internal shoulder 72 inside the receiving tube 68 so that the contact plunger 64 is yieldingly supported by the tube while FIG. 5 represents the biasing spring 70 as pressing against the contact head 66, in most cases biased spring contactors will dipose the biasing spring entirely within the confines of the receiving tube with only the contact head end of the contact plunger extending from the receiving tube. However, the operation of the latter described biased pin contactor will be identical to the biased pin contactor 56. The terminal end 58 of the receiving tube 68 of the biased pin contactor 56 is provided for connection to the test cable 60.

Although other face styles are available and theoretically usable, the outside face of the contact head 66 in the preferred embodiment is conically concave, and the back, nonfunctional end 52A of each connector pin 52 approximates a dull point in shape. Hence, when the contact head 66 contacts its mating connector pin 52, at its nonfunctional end 52A, electrical communication is established, and the front end (not shown) of the connector pin is left untouched, thus leaving the functional surface of the connector pin in its original pristine condition.

The test contactor holder 54 of the contact assembly 53 is supported for sliding to and fro movement on bearing surfaces (not shown), and a positioning screw 74 is provided to selectively produce such reciprocating movement to the test contactor holding 54. The positioning screw 74 is bearingly connected to the test contactor holder 54 and is rotated by a reversing electric motor 76. Applying electric power to the motor 76 will rotate the positioning screw 74 to move the test contactor holder 54 forward until the biased pin contactors 56 are in electrical contact with the connector pins 52 of the connector 16 seated in the nesting cavity 14. At the end of the test cycle, the motor 76 is reversed, turning the positioning screw 74 in the opposite direction and moving the test contactor holder 54 away from the connector 16 under test.

To remove the connector 16 from the nesting cavity 14 of the connector nest assembly 12, once the test contactor holder 54 is retracted, the ejector pin 20, via hand pressure against its thumb nut 44, is pushed from its resting position (where it is disposed so as to not interfere with the connector 16 under test) to an ejection position whereat the head portion 40 extends into the nesting cavity 14 to eject the connector 16 from the connector nest assembly 12. The connector 16 is then removed and a new connector is inserted to repeat the test cycle.

It will be clear that the present invention is well adapted to carry out the objects and attain the ends and advantages mentioned as well as those inherent therein. While a presently preferred embodiment has been described for purposes of this disclosure, numerous changes may be made which will readily suggest themselves to those skilled in the art and which are encompassed in the spirit of the invention disclosed and as defined in the appended claims.

What is claimed is:

1. An electrical connecting apparatus for supporting a multiple pin electrical connector under test so that the connector pins of the electrical connector can be electrically engaged at the nonfunctional ends thereof and thereby prevent marring of the functional ends of the connector pins, the apparatus comprising:

a connector nest assembly comprising:
 a housing member having a connector nesting cavity formed therein; and
 cantilever clamp means supported by the housing member for retaining the multi-pin electrical connector under test within the connector nesting cavity;

ejector means for ejecting the electrical connector from the connector nesting cavity in an unconnected mode; and contact means for contacting the connector pins of the connector, the contact means characterized as having a plurality of biased pin contactors disposed to make engagement with the nonfunctional ends of the connector pins in a connected mode so that electrical connection is made therewith while maintaining the pristine surface condition of the functional ends of the connector pins.

2. The electrical connecting apparatus of claim 1 wherein the connector nesting cavity in the housing member is dimensioned so as to support the connector under test in a fixed spatial orientation in relation to the contact means.

3. The electrical connecting apparatus of claim 2 wherein the cantilever clamp means comprises a clamp member extending in cantilever fashion over the connector nesting cavity, the cantilever clamp means supported at one end to the housing member so that insertion and removal of a connector from the nesting cavity causes the clamp means to flex sufficiently to permit passage of the electrical connector, the clamp means maintaining sufficient force against the electrical connector so a to hold the electrical connector firmly within the connector nesting cavity during the test cycle.

4. The electrical connecting apparatus of claim 3 wherein the contact means comprises a reciprocatable test contactor holder supporting a plurality of biased pin contactors disposed to engage in point electrical contact the nonfunctional ends of the connector pins of the electrical connector under test while retaining the original pristine surface condition of the functional ends of the connector pins.

5. The electrical connecting apparatus of claim 4 wherein the ejector means comprises an ejector pin disposed to extend through an ejector pin bore in the housing member, the ejector pin being spring biased to assume a resting position in which the ejector pin is supported in non-interfering relation to the electrical connector under test, the ejector pin movable to an ejection position to eject the electrical connector from the connector nesting cavity.

6. The electrical connecting apparatus of claim 5 wherein the clamp member is transparent.

7. The electrical connecting apparatus of claim 6 wherein the clamp member is sufficiently flexible to assist in the activity of permitting the clamp member to flex away from the connector nesting cavity.

* * * * *

UNITED STATES PATENT AND TRADEMARK OFFICE
CERTIFICATE OF CORRECTION

PATENT NO. : 5,030,906

DATED : July 9, 1991

INVENTOR(S) : James A. Duff

It is certified that error appears in the above-identified patent and that said Letters Patent is hereby corrected as shown below:

Column 2, delete the paragraph appearing as lines 44-48 and substitute therefor:

--Other objects, features and advantages of the present invention will be apparent from the following detailed description when read in conjunction with the drawings and appended claims.-- ;

Column 4, line 30, delete "supported by the tube while" and substitute therefor --supported by the tube. While--;

Column 4, line 33, delete "dipose" and substitute therefor --dispose--; and

Column 4, line 56, delete "holding 54." and substitute therefor --holder 54.--.

Signed and Sealed this

Fifteenth Day of December, 1992

Attest:

DOUGLAS B. COMER

Attesting Officer

Acting Commissioner of Patents and Trademarks